United States Patent
Landes

(10) Patent No.: US 9,052,347 B2
(45) Date of Patent: Jun. 9, 2015

(54) METHOD OF TESTING THE PERFORMANCE OF ELECTRICAL JUNCTIONS IN AN AIRCRAFT CURRENT RETURN NETWORK

(71) Applicant: AIRBUS OPERATIONS (S.A.S.), Toulouse (FR)

(72) Inventor: Olivier Landes, Saint-Jean (FR)

(73) Assignee: Airbus Operations (S.A.S.), Toulouse (FR)

( * ) Notice: Subject to any disclaimer, the term of this patent is extended or adjusted under 35 U.S.C. 154(b) by 303 days.

(21) Appl. No.: 13/863,931

(22) Filed: Apr. 16, 2013

(65) Prior Publication Data

US 2013/0307555 A1    Nov. 21, 2013

(30) Foreign Application Priority Data

Apr. 17, 2012 (FR) ...................................... 12 53522

(51) Int. Cl.
*G01R 31/00* (2006.01)
*G01R 31/02* (2006.01)

(52) U.S. Cl.
CPC ............ *G01R 31/008* (2013.01); *G01R 31/006* (2013.01); *G01R 31/021* (2013.01); *G01R 31/026* (2013.01)

(58) Field of Classification Search
CPC .. G01R 31/006; G01R 31/008; G01R 31/021; G01R 31/026
See application file for complete search history.

(56) References Cited

U.S. PATENT DOCUMENTS

| | | | |
|---|---|---|---|
| 6,625,550 B1* | 9/2003 | Scott et al. ...................... | 702/58 |
| 6,782,329 B2* | 8/2004 | Scott ................................ | 702/58 |
| 7,485,800 B2* | 2/2009 | Berrada et al. ................. | 174/5 R |
| 8,264,215 B1* | 9/2012 | Kovach et al. .................. | 324/72 |
| 8,593,153 B2* | 11/2013 | Medelius et al. .............. | 324/543 |
| 2004/0100272 A1* | 5/2004 | Styles ............................ | 324/523 |
| 2006/0149427 A1* | 7/2006 | Evans .............................. | 701/1 |
| 2008/0084201 A1* | 4/2008 | Kojori ........................ | 324/117 R |
| 2008/0231294 A1* | 9/2008 | You et al. ...................... | 324/725 |
| 2009/0322557 A1* | 12/2009 | Robb et al. ................. | 340/870.3 |
| 2011/0080176 A1* | 4/2011 | Hopdjanian et al. .......... | 324/503 |
| 2012/0027058 A1* | 2/2012 | Lynch et al. .................. | 375/219 |
| 2012/0223720 A1* | 9/2012 | Landes et al. ................. | 324/533 |

OTHER PUBLICATIONS

Apra M et al., "Lightning Indirect Effects Certification of a Transport Aircraft by Numerical Simulation," IEEE Transactions on Electromagnetic Compatability, 2008, pp. 513-523, vol. 50, No. 3, IEEE Service Center, New York, NY, U.S.
French Search Report for Application No. FR 766496 dated Jan. 25, 2013.

* cited by examiner

*Primary Examiner* — Huy Q Phan
*Assistant Examiner* — Adam Clarke
(74) *Attorney, Agent, or Firm* — Jenkins, Wilson, Taylor & Hunt, P.A.

(57) ABSTRACT

A method of testing an electrical junction between a first metallic element and a second metallic element in an aircraft current return network, said network comprising a plurality of metallic elements, each of which is connected to at least two other elements, said aircraft comprising at least one element made of a composite material connected to said network. The method is remarkable in that its use does not damage the composite structure of the aircraft.

4 Claims, 3 Drawing Sheets

METHOD OF TESTING THE PERFORMANCE OF ELECTRICAL JUNCTIONS IN AN AIRCRAFT CURRENT RETURN NETWORK

CROSS-REFERENCE TO RELATED APPLICATION

This application claims priority to French Patent Application No. 12 53522 filed Apr. 17, 2012, the entire disclosure of which is herein incorporated by reference.

TECHNICAL FIELD

This invention relates in a general manner to the current return for electrical equipment onboard an aircraft comprising elements made of composite materials.

BACKGROUND

The electrical power supply for electrical equipment onboard an aircraft is traditionally provided by an electric current power supply cable and by a current return network constituted by the aircraft structure. The current return network may be considered like the general ground plane of the aircraft.

In an aircraft in which the fuselage elements and the primary structure (panels, frames, stringers) are made from a metallic material, the current return is made by the presence of many interconnected structural parts. The large number of interconnections from one end of the aircraft to the other makes it easy to transport current.

The design of recent aircraft makes use of composite materials for some parts of the external or internal structure of the aircraft in order to reduce aircraft weight.

The composite materials used such as carbon or resin and fibre alloys have low electrical conductivity and thus cannot be used to form a current return network. In this case, the current return is made using a network of high conductivity metallic structures called the ESN (Electrical Structural Network) network, located in the pressurised zone of the fuselage and composed largely of metallic structural elements.

FIG. 1 shows a global view of an ESN network 2 of part of an aircraft 1. FIG. 1 more particularly shows that the ESN network 2 of an aircraft is a meshed and redundant network because each element in the ESN network is connected to at least two other elements in the network. Redundancy of the ESN network is necessary to respect safety standards set down by civil aviation authorities.

More precisely, the ESN network is composed of structural metallic elements and metallic elements of junctions that guarantee electrical continuity between the different structural elements. FIG. 2 shows a straight section of the fuselage of an aircraft 1 comprising elements made of composite materials 3 and an ESN network.

There are two types of structural elements in an ESN network:

primary structure elements 4a of the aircraft, for example metallic frames, metallic cross-pieces, metallic seat rails, aircraft floor(s);

secondary structure elements 4b of the aircraft, that include metallic cross piece elements to support electrical equipment in the aircraft, for example such as computers.

There are also two types of junctions:

flexible electrical junctions of the "metallic braids" type, used for example to make some connections between primary and secondary elements in the ESN network.

electromechanical junctions that perform both mechanical and electrical functions. These are junctions based on rivets or screws and bolts, between two structural elements in the ESN network. In some cases, an electromechanical junction may be reinforced by a flexible junction.

An ESN network also comprises standard parts 4c for example such as U or I metallic components acting as supports for electrical cables of the aircraft. Such supports are called "raceways" in aeronautical language. Standard parts are connected to the primary or secondary structure elements of the network through flexible electrical or electromechanical junctions as defined above.

As shown in FIG. 2, the various structural elements in the ESN network are electrically connected at the composite/metal interfaces 5, to elements 3 made of composite materials that form part of the structure of the aircraft.

Electrical continuity between the different metallic elements making up the ESN network is only obtained after a so-called metallisation operation done during the aircraft production cycle.

Corrosion protective paint usually covers all metallic elements in the ESN network. Obviously, this paint is not conducting. Furthermore, intermediate mastic is often present at electromechanical junctions between the different structural elements in the ESN network to prevent contact wear phenomena.

The metallisation operation consists of stripping the paint and if necessary removing the intermediate mastic from a contact surface to locally expose the metallic element 4a, 4b being considered.

Small residual quantities of mastic or paint at a junction between two elements in the ESN network are sufficient to degrade the quality of the electrical contact and therefore the efficiency of the ESN network.

It can then be understood that junctions between the different elements in the ESN network have to be tested. This test must be possible when assembling the ESN network, or when repairing it or during aircraft inspections.

It is considered that an electrical junction in the ESN network has a satisfactory conduction performance if it is capable of transporting the current intensity for which it is specified for a sufficiently long time, in other words at least 60 seconds, without major overheating or degradation of its impedance. Electromechanical or flexible junctions in an ESN type network must be capable of transporting at least 50 A rms at a frequency of the order of 400 Hz.

Impedance measurement methods used traditionally in electronics, for example using a milli-ohmmeter or a current generator associated with a voltmeter, are not appropriate for testing junctions between two elements in an ESN network because the network is meshed and redundant.

FIG. 3 shows the implementation of the so-called 4-wire method, also called the Kelvin method, to measure the impedance of an electromechanical junction AB in the ESN network using a current generator 6 associated with a voltmeter 7. For obvious reasons of conciseness, the ESN network is shown diagrammatically in FIG. 3 and only electromechanical connections between the primary structure elements A, B, C, D, E of the network are illustrated. Resistances R1 and R2 are resistances due to interfaces between the ESN network and composite elements of the aircraft.

In applying this method, the current injected by the current generator 6, greater than or equal to 50 A, is distributed in the different branches formed by the different elements A, B, C, D, E and the composite elements of the aircraft, prorata to the resistances of each branch.

Consequently, the 4-wire method cannot test the performance of the junction AB because its application provides the measurement of the impedance of the junction AB in parallel with the rest of the network and not the junction AB alone.

Furthermore, this method is incapable of controlling the current intensity injected into the ESN network and its use can damage the composite structure that is particularly sensitive to passage of a current, particularly when the composite material used is carbon.

The invention discloses a method of testing the performance of an electrical junction between two metallic elements in an ESN network, which does not deteriorate the composite structure of the aircraft when used.

SUMMARY

This objective is achieved by a method of testing an electrical junction between a first metallic element and a second metallic element in an aircraft current return network, said network comprising a plurality of metallic elements, each of which is connected to at least two other elements, said aircraft comprising at least one element made of a composite material connected to said network, said method comprising the following steps:

a) use a current transformer to inject an alternating current into said network through a conductor, a first end of which is connected to said first element and a second end of which is connected to said second element, said transformer being electromagnetically coupled to said conductor and sized to supply a current with a minimum value to a load with a predetermined impedance called the nominal impedance;

b) measure the value of said current circulating in said conductor; the junction between said first metallic element and said second metallic element being identified as defective when the value of said current thus measured is less than said minimum value.

Advantageously, the method includes the following additional steps:

c) measure the voltage drop between said first metallic element and said second metallic element;

d) calculate the value of the impedance of said junction starting from the value of said current measured in step b) and the voltage drop thus measured, said junction being identified as being good quality when the value of the impedance calculated in step (d) is less than or equal to the nominal impedance.

The current transformer also comprises a torus that surrounds the conductor, the primary winding of said transformer being connected to an alternating current generator and is wound around the torus, the secondary of the transformer being formed by the conductor inside the torus, said alternating current generator supplying a current of 1 A at a frequency of between 100 Hz and 400 Hz, said transformer being sized to supply a minimum current of 50 A to said nominal impedance load.

In one variant embodiment of the method according to the invention, the conductor can be temporarily installed in parallel with said electrical junction between said first and said second metallic elements for the duration of the test.

BRIEF DESCRIPTION OF THE DRAWINGS

Other characteristics and advantages of the invention will become clear after reading the preferred embodiment of the invention with reference to the appended figures among which.

DETAILED DESCRIPTION

The basic idea of the invention is to test the conduction performance of a flexible or electromechanical junction between two elements in the ESN network, using a current transformer installed as a voltage step down transformer to inject a high intensity alternating current for the time of the test, into an electrical conductor placed in parallel with the junction to be tested.

As will be described later, putting the conductor and the junction to be tested into parallel makes it possible to obtain the impedance of the junction alone, using traditional measurement means such as ammeters or voltmeters.

Furthermore, the intrinsic properties of the current transformer, sized for a low impedance load, make it possible to control the current intensity injected into the ESN network and consequently not damage the composite elements of the aircraft.

According to the invention, the electrical conductor may be external to the ESN network in the sense that it is temporarily installed in parallel with the electromechanical or flexible junction to be tested, for the time of the test.

Figure 1:
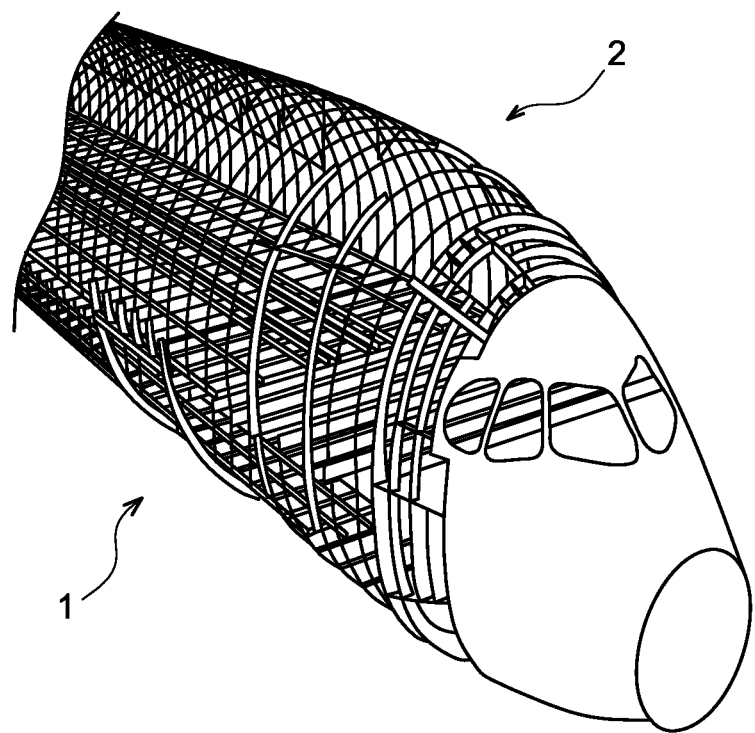
FIG. 1 already described, shows a global view of an ESN network in part of the fuselage of an aircraft.
Figure 2:
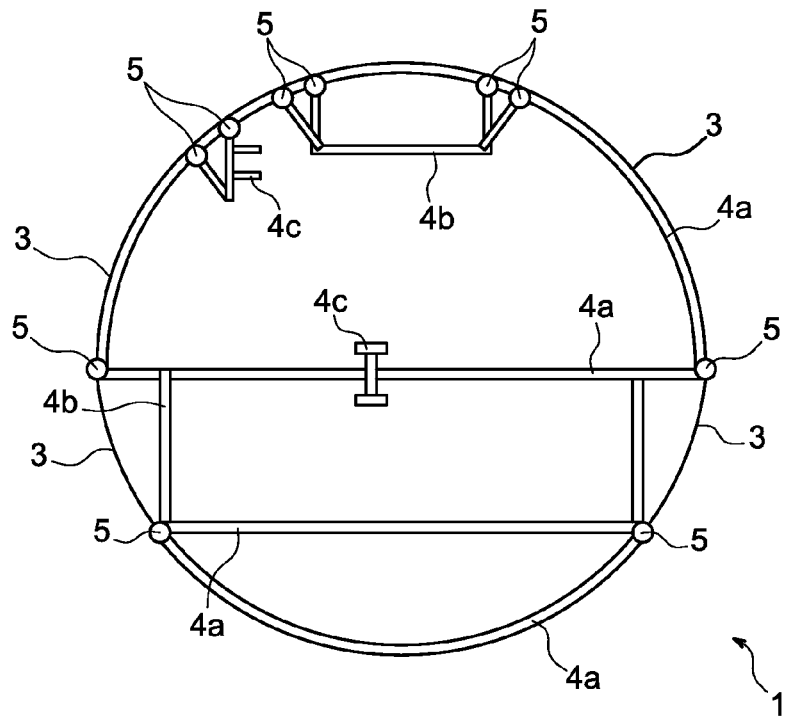
FIG. 2 already described, shows a straight section of the fuselage of an aircraft comprising elements made of composite materials and an ESN network.

As was seen with reference to FIG. 2, a flexible junction connecting two elements can be put in parallel with another flexible or electromechanical junction between these same two elements in order to locally increase the robustness of the network. In this case, it is possible to avoid the installation of a conductor external to the ESN network. The high intensity alternating current is then injected into the ESN network directly through the flexible junction put in parallel with the flexible or electromechanical junction to be tested.

Figure 3:
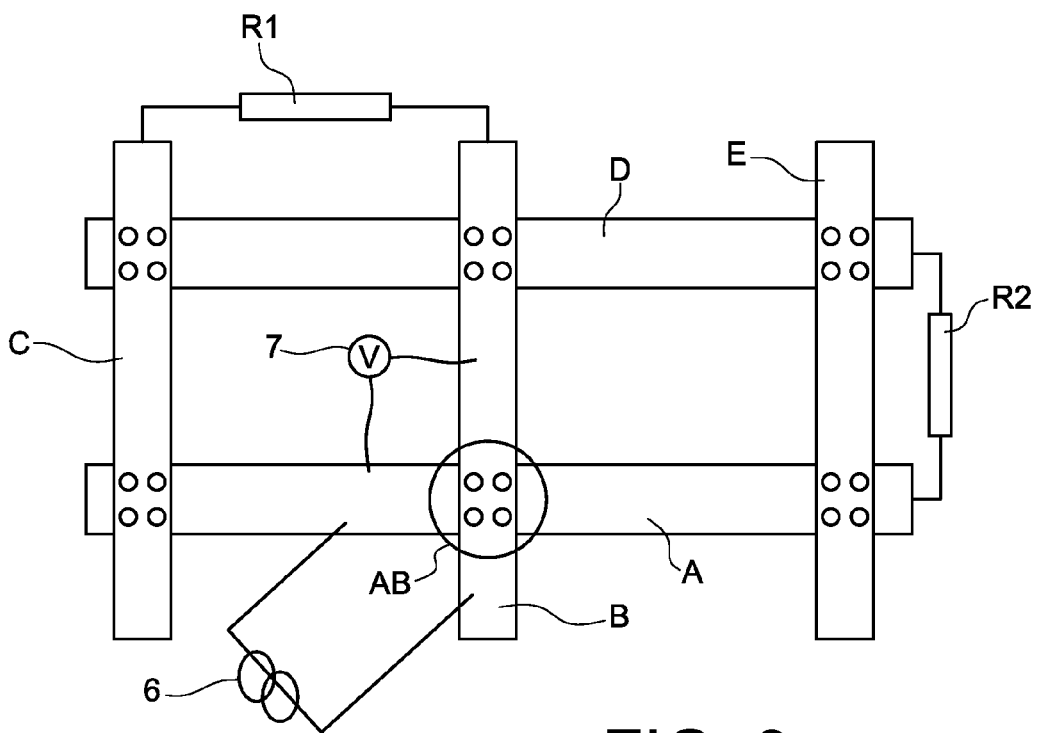
FIG. 3 already described, shows the use of the so-called 4-wire method in an ESN network shown diagrammatically, to measure the impedance of an electromechanical junction of the network.
Figure 4:
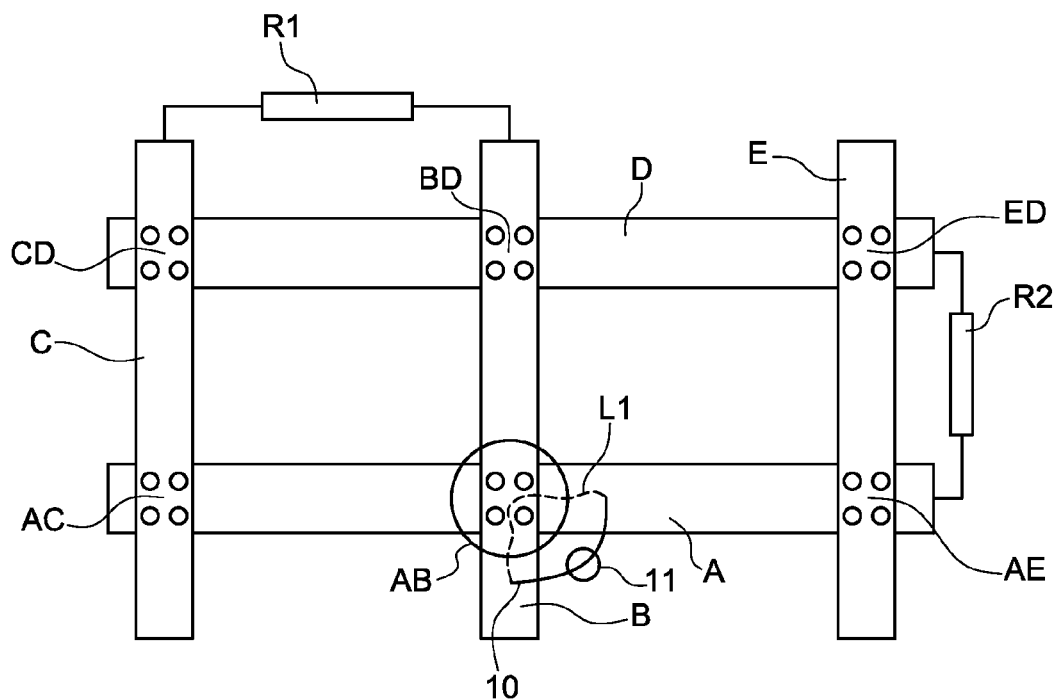
FIG. 4 shows the positioning of means of using the method according to the invention for testing a junction.

FIG. 4 shows the position of means to implement the method of testing a junction according to the invention. The ESN network shown in a simplified manner in FIG. 4 is identical to that shown in FIG. 3.

More precisely, FIG. 4 shows application of the method of testing a junction AB between a metallic element A and a metallic element B in the ESN network. The electrical junction between element A and element B is a junction taken among a plurality of existing junctions AC, CD, BD, ED, AE between the different metallic elements A, B, C, D, E forming the ESN network of the aircraft.

The junction AB shown in FIG. 4 is of the simple electromechanical type. Simple electromechanical means that the electromechanical junction is not reinforced by a flexible junction put in parallel. It is obvious that the description of the method given below with reference to FIG. 4 would be identical for a flexible connection or for an electromechanical connection reinforced by a flexible junction put in parallel. Some specific features specific to the latter two cases will be briefly described later.

The first step in the method of testing the conduction performance of the electrical junction AB according to the invention consists of injecting alternating current into the ESN network through a conductor 10 put in parallel with the junction AB. More precisely, the first end of the conductor is connected to element A, and the second end is connected to element B.

The current is injected by electromagnetic coupling through a current transformer 11 placed around the conductor 10.

The conductor 10 is advantageously made of copper or a material with low resistivity.

Before placement of the conductor, a local metallisation operation is firstly done on a small area of element A and element B, where the ends of the conductor 10 will be connected to elements A and B.

Figure 5:
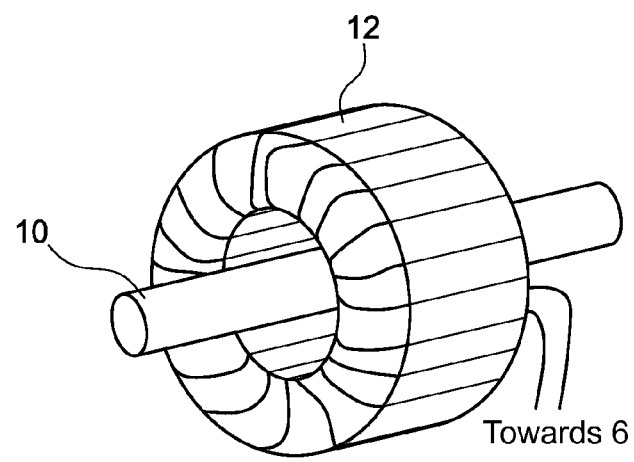
FIG. 5 diagrammatically shows a type of transformer used for application of the method according to the invention.

FIG. 5 shows the type of the current transformer 11 preferably used to inject a current in the conductor 10. The current transformer 11 is in the form of a torus 12 that surrounds the conductor 10. The primary winding connected to an alternating current generator 6 (not shown in FIGS. 4 and 5), is wound around the torus 12 while at the secondary, the turn is composed of the conductor 10 passing inside the toroidal magnetic circuit. The frequency of the alternating current is less than or equal to 400 Hertz, the frequency value used in aircraft.

Returning to FIG. 4, it can be understood that when a current is injected into the ESN network, a plurality of current loops (lines of least impedance) are formed passing through the conductor and elements in the ESN network. Other loops may be formed by the conductor, elements in the ESN network and elements made of composite materials.

Thus, a first loop L1 (shown in dashed lines in FIG. 4) is the line of least impedance that passes through the conductor 10, the portion of the element A between the first end of the conductor and the junction AB and the portion of element B between the second end of the conductor 10 and the junction AB.

Conventionally, the impedance of each of loop consists of a real part and an imaginary part.

The real part of the impedance of a loop depends particularly of the resistivity of the materials and the cross-section of the elements from which it is made, and the length of the loop.

The imaginary part of the impedance of a loop depends on its area and it is proportional to the frequency of the current injected into the network using the transformer.

For frequencies of more than 100 Hz, it is considered that the real part of the loops comprising metallic elements only is negligible compared with the imaginary part. The metallic elements in the ESN network, usually made of aluminium, have a low resistivity of the order of $26 \times 10^{-9} \Omega \cdot m$ at 300K. The method according to the invention is advantageously used at frequencies of between 100 Hz and 400 Hz. As an approximation, it can then be considered that the impedance of loops composed solely of metallic elements depends only on their area.

When the junction AB to be tested is good quality, the loop L1 is the loop with the lowest impedance because it has the smallest area. It can be understood that the other loops will have a very much higher impedance than loop L1.

For example, for a good quality electromechanical connection between two elements of a metallic frame in the ESN network, it is estimated that the impedance is of the order of 1 milli-Ohm for a frequency of between 100 Hz and 400 Hz. The impedance of the other current loops that pass through the metallic elements in the ESN network is of the order of about a hundredth of an Ohm or even more for the same frequency range.

The impedance of the current loops that pass through elements made of composite materials is of the order of a tenth of an Ohm or even more. These loops firstly have a large area and the values of the resistances R1 and R2 at the interface between the ESN network and the elements made of composite materials are not negligible, even at frequencies above 100 Hz. Furthermore, the resistivity of composite elements such as carbon is very high, of the order of $30\,000 \cdot 10^{-9} \Omega \cdot m$ at 300K.

Therefore, considering the impedances of the different loops, it may be considered that the junction AB transports almost all the alternating current supplied by the transformer 11 when this transformer is good quality.

The transformer 11 must supply a minimum current of 50 A to a load at the secondary at a frequency of between 100 Hz and 400 Hz, starting from a current of the order of 1 A at the primary. The transformer is sized for a load with impedance equal to the required impedance of junction AB when it is good quality.

For convenience, the impedance of the load for which the transformer 11 is sized will be called the nominal impedance in the remainder of this description.

Consequently, performance under load of the transformer 11 is maintained for impedance values approximately equal to the nominal impedance.

A compact current transformer is suitable for nominal values of the order of a milli-Ohm or even a tenth of a milli-Ohm, particularly for application of the method according to the invention in parts of the aircraft with particularly difficult access.

The second step of the method consists of measuring the value of the current circulating in the conductor 10. A state-of-the-art conventional current sensor of the ammeter type is used to achieve this. As a variant, the value of the current circulating in the conductor 10 may be deduced from the current measured at the transformer primary.

The second step of the method represents a first quality test of junction AB between element A and element B. The impedance of junction AB will be high, of the order of a tenth of an Ohm or more, if it is very bad quality. Consequently, the current loops back through the other impedance loops that are very much higher than the nominal value expected for junction AB. In this case, it becomes impossible to inject a current equal to or more than 50 A using the transformer. The transformer is not sized to supply such a current to impedances very much higher than the nominal value.

Measurement of the current circulating in the conductor thus gives a first coarse indication about the quality of the junction AB.

In addition to being easy to use, the compact transformer has the advantage that it protects elements made of composite materials present in some of the network loops. As described above, the transformer is not capable of injecting a high current into the ESN network when the load impedance is very much more than the nominal value, which is the case for the impedance of the loops passing through elements made of composite materials. Therefore, application of the method according to the invention does not damage the composite structure of the aircraft.

If a current value equal to at least 50 A is measured in the conductor 10 during the second step in the method, then it is considered that almost all the current is transported through the loop L1.

The remainder of the method consists of refining measurements of electrical magnitudes characteristic of junction AB in order to verify that its impedance is less than or equal to its nominal value, to determine its performance in conduction.

The nominal value of the impedance represents a maximum allowable impedance threshold beyond which the junction AB is identified as being defective.

The third step of the method consists of measuring the voltage drop between element A and element B.

For example, this measurement is made using a voltmeter and test probes applied to locally metallised surfaces on each part of the junction AB.

The fourth step of the method consists of calculating the value of the impedance of junction AB starting from the current value measured during the second step and the voltage drop measured during the third step.

The value of impedance of the junction AB thus calculated is compared with its nominal value which will depend on the type of junction tested and its location in the network. The junction quality is good when the value of the calculated impedance does not exceed the nominal value.

Advantageously, the nominal impedance of a junction is determined taking account of the impedance added by the conductor 10, the resistances at interfaces between the conductor 10 and elements A and B and the non ideal behaviour of the transformer 11, in the form of a tolerance margin.

When the junction to be tested is an electromechanical junction reinforced by a flexible junction placed in parallel, the steps in the method described above are identical except for a few implementation variants.

In this case, the conductor used is the flexible junction put in parallel. Thus, the flexible junction may be metallised over all or part of its length in order to put intensity measurement instruments into position and to enable satisfactory magnetic coupling with the transformer primary.

The current transformer is chosen from among models for which the torus may be split into two parts, or from among models for which the torus is in the form of a split ring, to install it around the flexible junction in the ESN network.

When the junction to be tested is a flexible junction between two elements A and B in the ESN network, then it acts as the conductor. Since the network is redundant, the flexible junction to be tested is contained in a loop and the method according to the invention can then be implemented. This case offers the best precision for measurement of the impedance of the junction to be tested, because the entire current is transported by the conductor.

The flexible junction that acts as conductor is metallised over the entire length or part of the length in order to place intensity measurement instruments and to enable correct magnetic coupling with the transformer primary.

The current transformer is chosen from among models for which the torus may be split into two parts in order to mount it around the flexible junction in the ESN network, or among models for which the torus is in the form of a split ring.

At the end of the method, the parts that had been metallised for its implementation will be repainted with an anticorrosion aviation paint.

The method according to the invention can be used for all flexible or electromechanical junctions in the ESN network. The method may be used easily and quickly in all parts of the aircraft, during assembly of ESN junctions, or when making repairs or checking the lack of aging during the life of the aircraft.

The method uses low cost off-the-shelf components.

The invention claimed is:

1. Method of testing an electrical junction between a first metallic element and a second metallic element in an aircraft current return network, said network comprising a plurality of metallic elements, each of which is connected to at least two other elements, said aircraft comprising at least one element made of a composite material connected to said network, said method comprising the following steps:
   a) use a current transformer to inject an alternating current into said network through a conductor a first end of which is connected to said first element and a second end of which is connected to said second element, said transformer being electromagnetically coupled to said conductor and sized to supply a current with a minimum value to a load with a predetermined impedance called the nominal impedance;
   b) measure the value of said current circulating in said conductor;
the junction between said first metallic element and said second metallic element being identified as defective when the value of said current thus measured is less than said minimum value.

2. Testing method according to claim 1, also comprising the following steps:
   c) measure the voltage drop between said first metallic element and said second metallic element;
   d) calculate the value of the impedance of said junction starting from the value of said current measured in step b) and the voltage drop thus measured,
said junction being identified as being good quality when the value of the impedance calculated in step (d) is less than or equal to the nominal impedance.

3. Testing method according to claim 1, characterised in that said current transformer comprises a torus that surrounds the conductor, the primary winding of said transformer being connected to an alternating current generator and is wound around the torus, the secondary of the transformer being formed by the conductor inside the torus, said alternating current generator supplying a current of 1 A at a frequency of between 100 Hz and 400 Hz, said transformer being sized to supply a minimum current of 50 A to said nominal impedance load.

4. Testing method according to claim 1, characterised in that said conductor is temporarily installed in parallel with said electrical junction between said first and said second metallic elements for the duration of the test.

* * * * *